United States Patent [19]

Ellis, Jr. et al.

[11] Patent Number: 4,696,702
[45] Date of Patent: Sep. 29, 1987

[54] METHOD OF DEPOSITING WIDE BANDGAP AMORPHOUS SEMICONDUCTOR MATERIALS

[75] Inventors: Frank B. Ellis, Jr., Princeton Junction; Alan E. Delahoy, Rocky Hill, both of N.J.

[73] Assignee: Chronar Corp., Princeton, N.J.

[21] Appl. No.: 933,972

[22] Filed: Nov. 24, 1986

Related U.S. Application Data

[63] Continuation of Ser. No. 694,650, Jan. 24, 1985, abandoned.

[51] Int. Cl.$^4$ ............................................. H01L 21/205
[52] U.S. Cl. ............................... 437/88; 136/258 AM; 427/74
[58] Field of Search ............... 148/174; 136/258 AM; 357/2, 30, 59 C; 427/39, 74, 86

[56] References Cited

U.S. PATENT DOCUMENTS 4,451,538  5/1984  Tanner ............................. 428/447
4,459,163  7/1984  MacDiarmid et al. ............. 148/174

OTHER PUBLICATIONS

T. Inoue et al., *Appl. Phys. Lett.*, vol. 44, pp. 871–873 (1984).
T. Tanaka et al., *Appl. Phys. Lett.*, vol. 45, pp. 865–867 (1984).
A. E. Delahoy, *Proceedings SPIE*, vol. 407, pp. 47–54 (1983).
V. L. Dalal et al., Conference Record, 16th IEEE *Photovoltaic Specialists Conf.* (1982), pp. 1384–1388.
S. S. Hegedus et al., *Conference Record, 17th IEEE Photovoltaic Specialists Conf.* (1984), pp. 239–244.
M. Hirose, Chapter 3.2 in *JARECT*, vol. 16, Amorphous Semiconductor Technologies & Dences (1984), Y. Hamakawa, editor, OHMSHA Ltd & North Holland Pub. Co., pp. 67–79.

*Primary Examiner*—Aaron Weisstuch
*Attorney, Agent, or Firm*—George E. Kersey

[57] ABSTRACT

A method of depositing wide bandgap p type amorphous semiconductor materials on a substrate without photosensitization by the decomposition of one or more higher order gaseous silanes in the presence of a p-type catalytic dopant at a temperature of about 200° C. and a pressure in the range from about 1–50 Torr.

8 Claims, 4 Drawing Figures

METHOD OF DEPOSITING WIDE BANDGAP AMORPHOUS SEMICONDUCTOR MATERIALS

This is a continuation of Ser. No. 694,650, filed Jan. 24, 1985, now abandoned.

BACKGROUND OF THE INVENTION

This invention relates to wide bandgap materials, particularly for solar cells.

In the case of solar cells, photosensitive material such as silicon is deposited on or associated with a transparent conductive oxide. In many cases there can be an undesirable interaction between the silicon and the transparent conductive oxide. A common transparent conductive oxide is tin oxide which, with respect to silicon, is thermodynamically unstable. In particular, the free energy of formation for tin oxide is about $-124$ kilocalories per mole at standard temperature and pressure (STP), while the free energy for formation of silicon dioxide at STP is about $-192$ kilocalories per mole. The rate of interaction between the silicon and the transparent conductive oxide depends upon temperature. At elevated temperatures (above about 300 degrees C. to 400 degrees C.), the rate of interaction is fast and, in the case of tin oxide and silicon, leads to a chemical reduction of the transparent conductive layer. There is also the oxidation of the silicon layer in the vicinity of the tin oxide layer and the diffusion of elemental tin into the silicon layer. As a result the transparent conductive oxide loses its transparency, as well as its conductivity. An insulating silicon oxide layer forms and tin diffuses throughout much of the silicon layer.

For an amorphous silicon solar cell having the structure glass/tin oxide/p-i-n/metal, where the p, i and n denotes p-type, intrinsic, and n-type hydrogenated amorphous silicon, respectively, it is desirable for the p-type layer to have a wide optical bandgap in order that most of the incident light can be absorbed in the photovoltaically active i-layer of the device. Such wide gap doped layers are practically non-absorbing for visible light and are called window layers. The bandgap of a semiconductor is defined as the energy gap between the top of the valence band and the bottom of the conduction band.

A common technique for the formation of semiconductive materials involves the use of plasma deposition or plasma-assisted chemical vapor deposition. Unfortunately, these techniques involve both "energetic" particles and atomic hydrogen which may increase the degree of interaction between the semiconductor layer and associated transparent conductive layers. For example, in the plasma-assisted chemical vapor deposition of hydrogenated amorphous silicon (a-Si:H) on tin oxide, tin has been observed well into the silicon layer using elemental depth profiling techniques ( Appl. Phys. Lett. 43, 101-1983).

The bandgap of intrinsic (undoped) a-Si:H is typically 1.75 eV. When a-Si:H is doped p-type the bandgap usually shrinks to about 1.4 eV and the material becomes strongly absorbing. For this reason the source materials for the doped semiconductive p-type layer often include carbon in an attempt to widen the bandgap. Unfortunately, the presence of carbon in intrinsic (i) layers of hydrogenated amorphous silicon has been reported to cause impairment in the quality of the layer (*J. Non-Cryst. Solids*, 66, 243-1984). Accordingly, although carbon is commonly employed in wide bandgap materials, it may be desirable in many situations to achieve such bandgaps without the employment of cabon—thus reducing the possibility of subsequent carbon contamination of the i-layer.

Accordingly, it is an object of the invention to facilitate and improve the production and utilization of wide bandgap materials. For wide gap hydrogenated amorphous silicon, the bandgap should exceed about 1.9 eV. A related object is to achieve wide bandgap materials which avoid many of the disadvantages of the prior art.

Another object of the invention is to realize wide bandgap materials which can be employed in conjunction with other associated materials without cross contamination. A related object is to increase the compatibility between transparent conductive oxides, used, for example, in the fabrication of solar cells, and associated semiconducting layers. Another related object is to increase the compatibility between tin oxide and an associated silicon material used in the manufacture of solar cells.

Still another object of the invention is to achieve wide bandgap materials without the creation of excessively energetic particles such as ions or electrons. An associated object is to provide alternative techniques for the realization of wide bandgap materials without the employment of plasma or plasma-assisted deposition. A closely related object is to achieve a wide bandgap p-layer at the low temperature (180 degrees. C.–300 degrees C.) used in plasma-assisted deposition but without the plasma or energetic ions or electrons.

Still another object of the invention is to obtain wide bandgap materials which are practically transparent to the desired optical energy. A related object is to obtain wide bandgap materials with and without carbon alloying.

SUMMARY OF THE INVENTION

In accomplishing the foregoing and related objects, the invention provides a method for the fabrication of wide bandgap materials by decomposing one or more gaseous phase, higher order silanes in the presence of a dopant. The dopant can be used to produce a p-type material or an n-type material.

In accordance with one aspect of the invention, the dopant for p-type material is a boron contributor such as diborane. The diborane has a catalytic effect on the thermal decomposition of the silane gases and consequently permits realization of the desired bandgap material at a lower temperature (e.g. at 180–300 degrees C., instead of 400–500 degrees C.). The consequence of using the lower temperature is that there is less interaction between the depositing p-type material and the material it is deposited on, e.g. tin oxide.

In accordance with another aspect of the invention, the decomposition of the higher order silanes takes place at a temperature in the range from about 180 degrees to about 300 degrees C. due to the catalytic effect of an appropriate dopant, e.g. diborane. In some cases, e.g. where the material is not deposited on tin oxide, the temperature can range as high as 470 degrees C. and nevertheless produce a desirable product. The pressure range extends from about 1 to about 50 Torr and the gas-phase residence time (the time the gases reside in the deposition chamber) of the gases involved in the decomposition is in the range from about 1 to about 500 seconds.

In accordance with yet another aspect of the invention, n-type dopants can be employed such as phosphorus containing materials like phosphine. However, in this case carbon alloying is necessary to achieve a window layer since a low deposition temperature (below about 400 degrees C.) is not possible. An appropriate carbon contributor is acetylene.

In accordance with a still further aspect of the invention, semiconductor devices are realized by a plurality of semiconductive layers, at least one of which is formed by the pyrolysis of one or more higher order silanes. The pyrolytically formed layer may be supplemented by one or more pyrolytically formed layers or by layers formed in other ways, including glow discharge and glow discharge-assisted pyrolysis. The devices can include transparent conductive oxide layers which are of tin oxide or of indium oxide or indium tin oxide.

DESCRIPTION OF THE DRAWINGS

Other aspects of the invention will become apparent after considering several illustrative embodiments, taken in conjunction with the drawings in which.

DETAILED DESCRIPTION

Figure 1A:
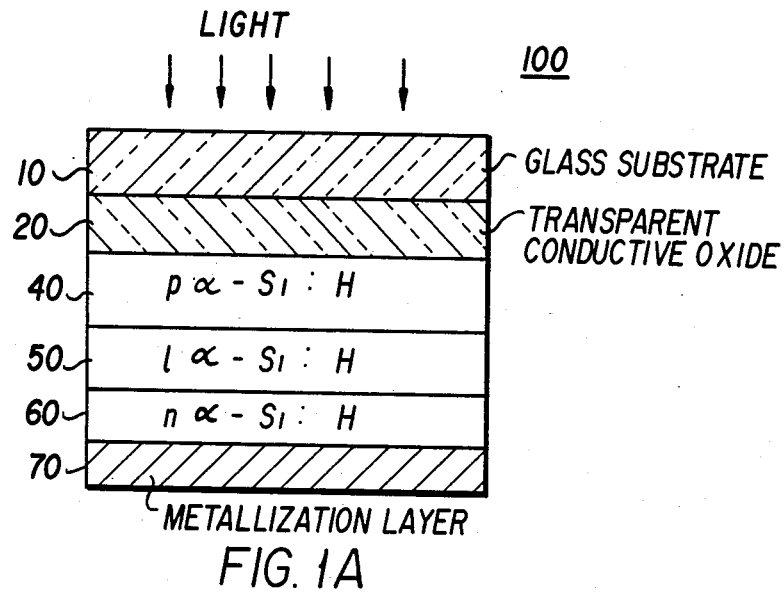
FIG. 1A is a schematic view of an illustrative solar cell in accordance with the invention.
Figure 1B:
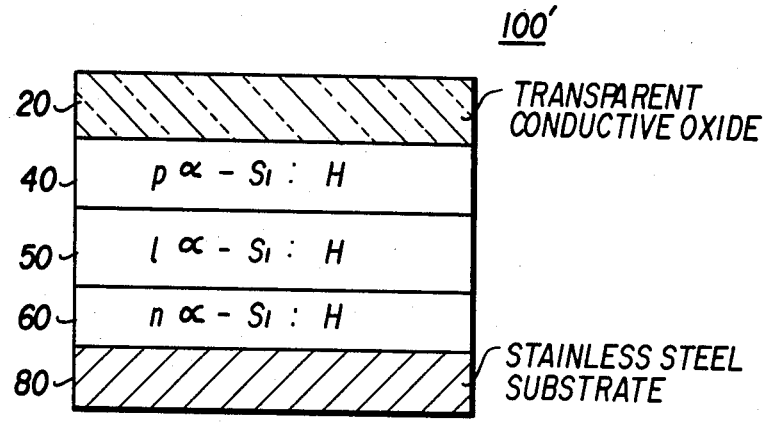
FIG. 1B is a schematic view of an alternative illustrative solar cell in accordance with the invention.

With reference to the drawings, FIGS. 1A and 1B illustrate hydrogenated amorphous silicon (a-Si:H) solar cells in accordance with the invention.

A cell 100 of FIG. 1 includes a glass support 10 through which sunlight passes to the interior of the cell in order to produce the desired conversion of sunlight into electrical energy. A transparent conducting oxide 20, such as doped tin oxide, is used to provide electrical contact to the doped a-Si:H layer. The underlying p-layer 40 of a-Si:H is prepared in accordance with the invention to eliminate the extent of reaction between it and the overlying transparent conductive oxide layer 20. The remaining layers 50 and 60, respectively of intrinsic (i) a-Si:H and n-type a-Si:H, can be deposited in a wide variety of ways. Suitable techniques include plasma and plasma-assisted chemical vapor deposition (PACVD). In addition, CVD or pyrolysis may be employed alone, provided the deposition temperature of the i and n layers do not substantially exceed that of the p-layer. The final layer in FIG. 1A is a metallic layer 70 to provide electrical contact to the overlyihng amorphous silicon layers. A diffusion barrier or other layer may be included between layer 70 and the adjoining amorphous silicon layer 60 in order to increase stability.

In the alternative cell 100' of FIG. 1B, a stainless steel support 80 is used instead of a glass plate 10 for the cell 100 of FIG. 1A. The transparent conductive oxide layer 20 can be of indium oxide or indium tin oxide in place of tin oxide.

The apparatus used for the solar cells 100 and 100' of FIGS. 1A and 1B can include glow discharge apparatus where the discharge is not used for the low temperature, thermally deposited p-layer.

In order to produce the p-layers 40 of FIGS. 1A and 1B, a catalytic dopant such as diborane is employed. It is known that diborane catalyzes the thermal decomposition of monosilane (M. Hirose, et al., *J. Non-Cryst. Solids*, 35–36, 297–1980). M. Hirose and his colleagues employed a deposition temperature of 550 degrees C. with diborane to produce p-layers and 650 degrees C. without diborane when the dopant was phosphine. Although the p-layers may have a dark conductivity on the order of $10^{-2}$ to $10^{-4}$ reciprocal ohm centimeters, they are highly absorbing of visible light and produce low open circuit voltages when use in solar cell configurations. Consequently, these films make very poor p-layers for solar cell devices.

In accordance with the present invention for making p-layers, disilane (or higher silane) is substituted for monosilane and a temperature below which disilane (or the higher silane) decomposes is used, and the result is a wide bandgap material. When the resultant material is used in a device, it produces a larger open circuit voltage than comparable layers produced from monosilane.

In addition, when the diborane is mixed with additional silanes, such as trisilane and even higher silanes, pyrolytic decomposition produces an even larger open-circuit voltage. In one example, a suitable silane mixture was analyzed by gas chromatography and indicated 15 percent monosilane, 15 percent disilane and 70 percent trisilane, with an undetermined amount of tetrasilane and still higher silanes.

Using the thermal pyrolysis of diborane and mixtures of silanes including significant amounts of trisilanes, p-type material has been produced in the temperature range from about 180 degrees C. to 300 degrees C. Deposition pressures between about 1 and 20 Torr have also been used successfully. Above a few Torr, roughly 5 Torr, depending upon the gas composition and flow rate, undesirable powder byproducts may be produced. A useful ratio of diborane to silanes concentration for p-type hydrogenated amorphous silicon (to be used in solar cells) is $0.5 \times 10^{-2}$ to $3 \times 10^{-2}$. The diborane is typically diluted by an inert gas carrier, for example 1 percent diborane in helium. At 200 degrees C. and a pressure of 2 Torr, flow rates such that the gas-phase residence time is about 2 seconds is also desirable. By varying deposition conditions, the boron concentration of the film varies from below the Auger detection limit, i.e. less than about 1 atomic percent, to about 10 atomic percent.

Figure 2A:
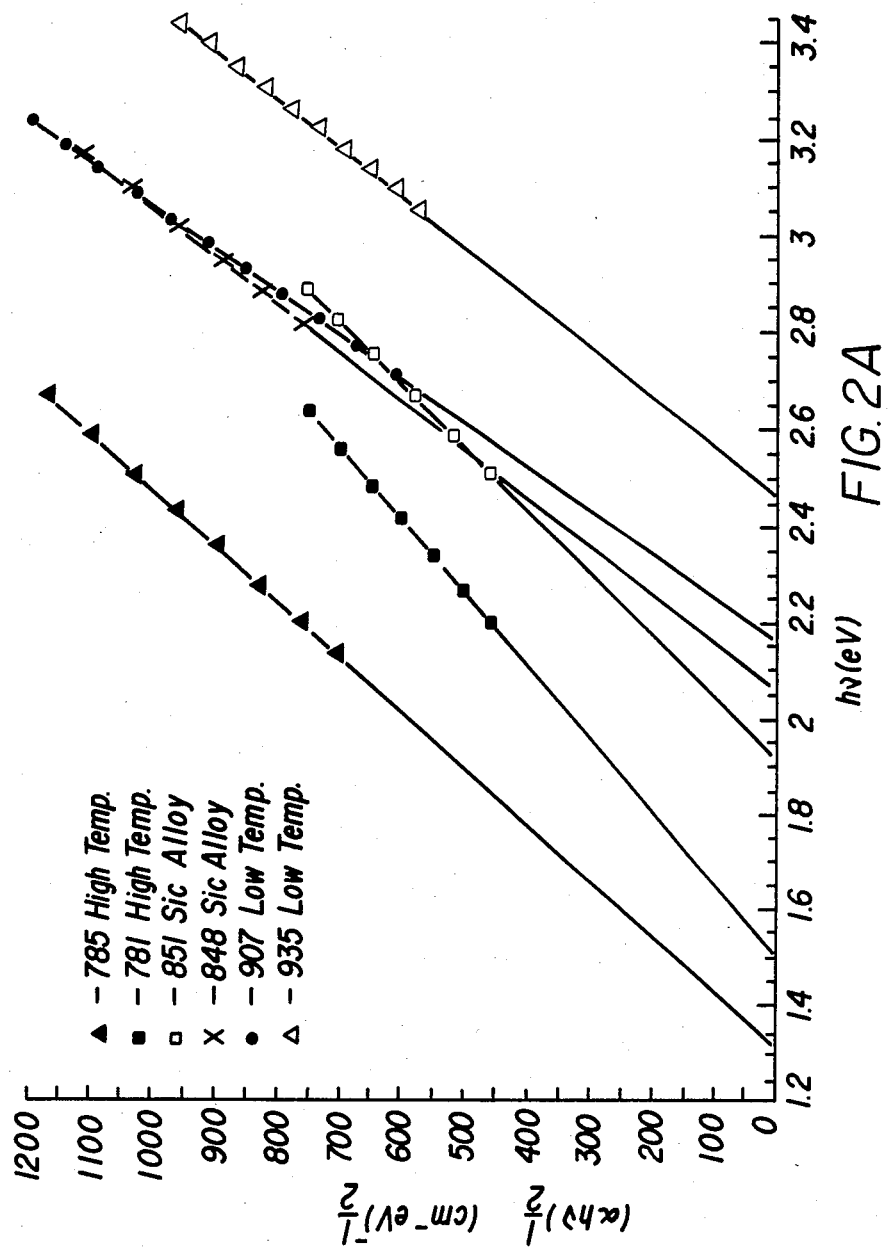
FIG. 2A is a graph illustrating the optical properties of various semiconductive layers in accordance with the invention.

The optical bandgap, as measured on thin film (0.1 to 0.2 microns) can be varied over a wide range, for example from 1.7 to 2.4 electron volts (See FIG. 2A and TABLE I). Thus the properties of the p-layer can be tailored largely to meet the needs of the device to be produced. As the bandgap increases, the resistivity of the film also increases. In solar cell applications, the maximum usable bandgap is about 2 electron volts where the activation energy of the dark conductivity has been measured on one sample to be about 0.4 electron volts. Consequently, the properties of the p-layer in accordance with the invention are similar to those obtained for plasma-assisted CVD of boron doped silicon carbon alloys. However, in the case of the invention, they are obtained without the use of carbon and without the use of energetic ions, electrons or photosensitization.

The wide optical bandgap is a consequence of the low deposition temperature and higher silane gases that are employed. Below about 370 degrees C., thermal decomposition of higher silanes is negligibly slow and there is insufficient thermal energy to break unstressed silicon-hydrogen bonds. The deposition of the boron doped hydrogen amorphous silicon film is initiated by the decomposition of diborane into reactive intermediates which subsequently react with the higher silanes to produce silicon and boron containing intermediates from which the film is grown. For appropriate gas mixtures at low deposition temperatures, the resulting films have a high hydrogen concentration (based on SIMS—Secondary Ion Mass Spectrometry—analysis, which for sample 935 shows 26 atomic percent hydrogen). Because the silicon-hydrogen bond is stronger than the silicon-silicon bond, the presence of the high hydrogen concentration greatly increases the optical bandgap of the material or, equivalently, reduces the absorption of visible light within the material.

Solar cells produced in accordance with FIG. 1A, i.e. using the wide bandgap layer 40 of the invention, have resulted in a suitably high short-circuit current density, about 20 percent higher than typically observed in prior cases. This result indicates that there is little absorption of visible light in the wide bandgap p-layer and there is little, if any, diffusional contamination between the transparent conductive oxide and the i-layer. The latter would degrade the i-layer and thus reduce the short-circuit current. Solar cells in accordance with FIG. 1A have also yielded relatively high open-circuit voltages, e.g. up to 0.83 volts.

In the foregoing experiment, the p-layer was deposited in a reactor without any glow discharge. The same reactor was subsequently used with glow discharge to produce the intrinsic and the subsequent n-layer. Thus, multiple deposition chambers are not necessary for the practice of the invention.

It is also possible, in accordance with the invention, to produce hybrid p-layers in which the first half of the layer is produced in accordance with the invention so that no plasma interacts with transparent conductive oxide, but the second half of the p-layer can be produced in accordance with any of the known techniques of the prior art which would be objectionable if there would be contact with the transparent conductive oxide but which are unobjectionable for contact with other amorphous silicon layers.

In the pyrolysis of diborane and trisilane (containing some disilane and tetrasilane), the boron/silane ratio in the film was about 2 to 4 times largeer than the initial diborane/silane gas phase ratio for deposition temperatures between 200 degrees C. and 470 degrees C. In the p-layer of device 902 (See TABLE I) the boron/silicon ratio of the p-layer is about 4 percent according to the Auger analysis.

With reference to TABLE I, there is a trend of increasing open-circuit voltage with increasing silane order and decreasing temperature. For diborane/trisilane mixtures at 200 degrees C. to 280 degrees C., an open-circuit voltage of 0.70 to 0.72 volts is obtained for all CVD devices. For a fixed boron concentration, as the temperature decreases the bandgap increases. This is believed to be a consequence of high hydrogen concentration.

It is further believed that there are two principal mechanisms for the loss of hydrogen from silicon-hydrogen bonds. The first occurs in both the gas phase and solid phase and is the hydrogen loss induced by the decomposition of diborane and the subsequent reaction. The second occurs in the solid phase and is the hydrogen loss associated with reducing stress by bond rearrangement. At 200 degrees C. there is not much energy available for bond rearrangement. A SIMS analysis of sample 932 in TABLE II indicates about 26 percent atomic percent hydrogen based upon comparison with a 17 atomic percent amorphous silicon hydride standard.

With reference to TABLE II, it is to be noted that at 200 degrees C. the dark conductivity increases and the optical bandgap decreases in the diborane/silane ratio increases, or equivalently, as the concentration of boron in the film increases.

At low diborane to disilane ratios, it is possible to produce wide bandgap material with disilane, and it is to be expected that an open-circuit voltage similar to that obtained from trisilane may be possible for disilane.

FIG. 2A and TABLE II show that the bandgap may be increased at high temperatures by adding acetylene to the silane/diborane mixture. At 470 degrees C. no deposition from acetylene on glass or crystalline/silicon is obtained. The carbon in the film arises from the interaction of acetylene with active silicon and boron containing intermediates. From TABLE II it appears that the low temperature wide barrdgap silicon p-layer and the high temperature wide bandgap silicon/carbon p-layer can be deposited with similar properties. In fact, plots of the temperature dependence of the dark conductivity of samples 907 and 851 are similar. However, only the low temperature p-layer is useful in amorphous silicon solar cells, since at 440 degrees C. to 470 degrees C. with acetylene/silane ratios from about 0.3 to about 0.5, the open circuit voltage obtained used the carbon containing p-layer is only between 0.5 and 0.56 volts. The largest open-circuit voltage is obtained at the low acetylene/silane ratio.

TABLE I

Representative p-layers as a function of temperature, pressure, ratio of initial diborane to silane concentration, and gas-phase residence time ($r_t$) in all CVD diagnostic Au/pin/ss devices illuminated by an ELH lamp at 100 mW/cm$^2$. For comparison, the $V_{oc}$ of Au/in/ss Schottky diodes is 0.45–0.50 volts.

| Sample | Silane | $T_{sub}/T_{wall}$ (°C./°C.) | Press. (Torr) | $\frac{[B_2H_6]_o}{[Silane]_o}$ (%) | $R_t$ (Sec) | Time (Sec) | $V_{oc}$ (Volts) |
|---|---|---|---|---|---|---|---|
| 793 | Monosilane | 470$^a$/400 | 20 | 0.7 | 13 | 45 | 0.36 |
| 791 | Monosilane | 470/400 | 2.2 | 0.7 | 1.5 | 60 | 0.40 |
| 774 | Trisilane$^b$ | 470/400 | 0.6 | 0.6 | 2.6 | 60 | 0.37 |
| 783 | Trisilane | 470/400 | 1.0 | 3.5 | 0.9 | 60 | 0.43 |
| 794 | Monosilane | 340/300 | 20 | 0.7 | 16 | 40 | 0.53 |
| 795 | Monosilane | 300/280 | 20 | 0.7 | 17 | 90 | 0.54 |
| 800 | Monosilane | 280/270 | 20 | 0.4 | 13 | 180 | 0.57 |
| 801 | Monosilane | 280/260 | 20 | 0.3 | 11 | 120 | 0.55 |
| 860 | Trisilane | 280/275 | 21 | 0.5 | 20 | 30 | 0.70 |
| 862 | Trisilane | 260/240 | 20 | 0.8 | 20 | 30 | 0.70 |

TABLE I-continued

Representative p-layers as a function of temperature, pressure, ratio of initial diborane to silane concentration, and gas-phase residence time ($r_t$) in all CVD diagnostic Au/pin/ss devices illuminated by an ELH lamp at 100 mW/cm$^2$. For comparison, the $V_{oc}$ of Au/in/ss Schottky diodes is 0.45–0.50 volts.

| Sample | Silane | $T_{sub}/T_{wall}$ (°C./°C.) | Press. (Torr) | $\frac{[B_2H_6]_o}{[Silane]_o}$ (%) | $R_t$ (Sec) | Time (Sec) | $V_{oc}$ (Volts) |
|---|---|---|---|---|---|---|---|
| 863 | Trisilane | 240/220 | 23 | 0.8 | 24 | 30 | 0.71 |
| 864 | Trisilane | 220/200 | 21 | 0.8 | 23 | 30 | 0.68 |
| 925 | Disilane | 200/180 | 2.3 | 1.5 | 3.2 | 120 | 0.62 |
| 866 | Trisilane | 200/180 | 20 | 0.8 | 25 | 60 | 0.71 |
| 868 | Trisilane | 200/180 | 10 | 0.8 | 20 | 90 | 0.71 |
| 869 | Trisilane | 200/220 | 6 | 0.8 | 7 | 120 | 0.72 |
| 902 | Trisilane | 200/180 | 2.5 | 1.5 | 3.5 | 120 | 0.70 |
| 873 | Trisilane | 200/180 | 2 | 0.8 | 2.4 | 120 | 0.72 |
| 870 | Trisilane | 200/180 | 1 | 0.8 | 1.1 | 150 | 0.66 |
| 867[c] | Trisilane | 175/160 | 22 | 0.8 | 26 | 60 | 0.70 |

[a]This is the temperature of the stainless steel substrate holder. The actual substrate temperature is, in general, slightly cooler.
[b]The silane designated "trisilane" consists of a mixture of higher silanes, including disilane and tetrasilane, where trisilane is the major component.
[c]This run resulted in a poor device. It is possible that the p-layer did not contact the i-layer well.

TABLE II

Optical and electronic properties of CVD p-layers. $R_t$ is the gas-phase residence time. The dark conductivity, $\sigma_d$, and the activation energy, $E_a$, are room temperature values; and the bandgap, $E_g$, and the slope are measured in the usual way from $(h\nu)^{0.5}$ vs. $h\nu$.

| Sample | Silane | $T_{sub}/T_{wall}$ (°C./°C.) | Press. (Torr) | $\frac{[B_2H_6]_o}{[Silane]_o}$ (%) | $R_t$ (Sec) | $\sigma_d$ (n-cm)$^{-1}$ | $E_a$ (eV) | $E_g$ (eV) | Slope (cm-eV)$^{-0.5}$ |
|---|---|---|---|---|---|---|---|---|---|
| 785 | Monosilane | 470[a]/405 | 2.5 | 0.7 | 1.6 | $4 \times 10^{-2}$ | | 1.32 | 867 |
| 799 | Monosilane | 280/260 | 20 | 0.4 | 13 | $1-2 \times 10^{-4}$ | | | |
| 781 | Trisilane[b] | 470/400 | 0.8 | 2.5 | 1.3 | $7 \times 10^{-3}$ | 0.20 | 1.50 | 659 |
| 782 | Trisilane | 470/400 | 0.9 | 3.7 | 0.9 | $1 \times 10^{-2}$ | | | |
| 850 | Trisilane[c] | 470/400 | 10 | 5.0 | 14 | $3 \times 10^{-3}$ | | 1.43 | 660 |
| 851 | Trisilane[d] | 470/400 | 10 | 5.0 | 13 | $2 \times 10^{-7}$ | 0.37 | 1.91 | 763 |
| 849 | Trisilane[e] | 470/400 | 10 | 5.0 | 13 | $9 \times 10^{-10}$ | | 1.94 | 787 |
| 848 | Trisilane[f] | 470/400 | 10 | 5.0 | 12 | $4 \times 10^{-10}$ | | 2.06 | 996 |
| 927 | Disilane | 200/180 | 2.7 | 1.5 | 6.8 | | | 1.87[g] | 840 |
| 928 | Disilane | 200/180 | 2.6 | 3.0 | 8.2 | $2 \times 10^{-5}$ | | | |
| 935 | Disilane | 200/180 | 50 | 0.04 | 610 | $9 \times 10^{-10}$ | | 2.46[g] | 968 |
| 907 | Trisilane | 200/180 | 2.4 | 1.9 | 6.9 | $5 \times 10^{-7}$ | 0.37 | 2.16[g] | 1100 |

[a]This is the temperature of the stainless steel substrate holder. The actual substrate temperature is, in general, slightly cooler.
[b]The silane designated "trisilane" consists of a mixture of higher silanes, including disilane and tetrasilane, where trisilane is the major component.
[c-f]Acetylene is added to the higher silane mixture. The respective acetylene to silane ratios are: 0.13, 0.48, 0.66, and 1.1. Auger analysis of sample #851 shows Si:C:B = 48:45:7.
[g]These films are only about 0.2 microns thick. The bandgap, as measured above, is thickness dependent. Thus, for comparison with the other films about 0.1–0.2 eV should be subtracted.

As acetylene is added to the gas-phase mixture for low temperature p-layers where diffusion of boron is not expected, the open-circuit voltage decreases. However, the addition of sufficient acetylene to the silane/phosphine mixture at 470 degrees C. to increase the bandgap of an n-layer by 0.2 to 0.3 electron volts and the substitution of the new n-layer in a P-I-N device does not decrease the open-circuit voltage. To the contrary, the built-in voltage is slightly larger. At low temperatures the open-circuit voltage tends to be the built-in voltage since the reverse dark saturation current is reduced. For a low temperature p-type hydrogenated amorphous silicon layered on an intrinsic and n-type hydrogenated amorphous silicon, and for a low temperature p-type hydrogenated amorphous silicon layered on an intrinsic hydrogenated amorphous silicon and further layered on an n-type hydrogenated amorphous silicon carbide, with measurements made near the temperature of liquid nitrogen, the respective open-circuit voltages are 0.99 volts and 1.05 volts.

Figure 2B:
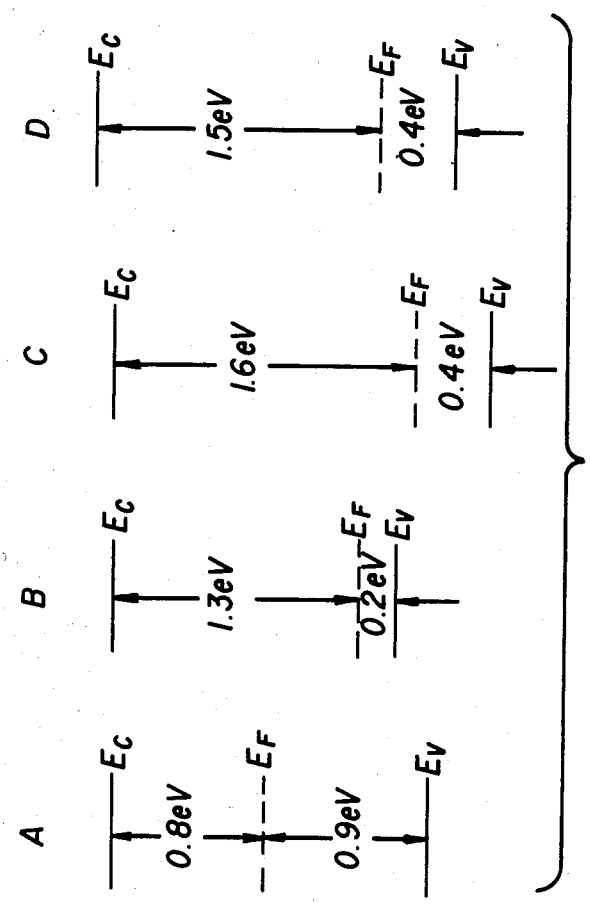
FIG. 2B is a schematic diagram of relative positions of band edges relative to Fermi levels of various layers. Examples C and D are in accordance with the invention.

Assuming that the different open-circuit voltages result from differences in built-in voltage, for a given bandgap and activation energy, a smaller work function is suggested in the n- and p-type layers made from acetylene/trisilane mixtures. As acetylene is added to the higher silanes, the bandgap of the resulting film increases at least in part by the shifting of the conduction band edge closer to the vacuum level as shown in FIG. 2B. This type of wide bandgap n-layer has potential use in many devices. In addition, a smaller acetylene silane ratio is needed to produce an n-layer of the same bandgap as a p-layer.

When the invention is used in the range from about 200 degrees C. to about 300 degrees C. with higher order silanes to deposit a wide bandgap p-layer without carbon, and incorporated into an all pyrolytically formed device, a typical open-circuit voltage is between 0.7 and 0.72 volts. In the case of a solar cell of indium tin oxide-PIN-stainless steel, the external solar energy efficiency is greater than 3 percent.

Low temperature wide bandgap pyrolytically produced p-layers are useful in hybrid CVD-glow discharge devices as, for example, discussed above regarding FIG. 1A. In a structure formed by glass/doped tin oxide/pyrolytically formed p-type hydrogenated amorphous silicon/glow discharge intrinsic and n-type hydrogenated amorphous silicon/metal, the tin oxide, amorphous silicon interface is thermodynamically unstable. For the same deposition temperature, without energetic electrons and ions, and without atomic hydrogen that is probably present in glow discharge, there may be less reduction of tin oxide and hence less tin diffusion into the hydrogenated amorphous silicon layers with a pyrolytically formed p-layer. Since the pyrolytically formed p-layer does not use a carbon source there is less likelihood of contamination in the i-layer, expecially near the p-layer/i-layer interface. As expected, the open-circuit voltage for hybrid structures is larger than for all CVD devices since glow discharge intrinsic layers have a significantly lower defect density and a slightly larger optical bandgap. In a recent test a hybrid device had an open-circuit voltage of 0.83 volts.

Another device with a low temperature pyrolytically formed p-layer exhibited an AM1 short-circuit current density 1-2 milliamperes per square centimeter higher than that obtained in devices employing a glow discharge hydrogenated amorphous silicon carbide p-layer with a bandgap of 1.85 electron volts.

The results of the experimental effort (excluding the hybrid device work) are summarized in TABLES I and II. In TABLE I representative p-layers are shown as a function of temperature, pressure, ratio of initial diborane to silane concentration and gas-phase residence time ($R_t$). The devices are formed by pyrolytic decomposition to form a PIN structure upon a stainless steel substrate and overlaying with a semitransparent gold contacting film. These devices were illuminated by a ELH lamp at 100 milliwatts per square centimeter. For comparison the open-circuit voltage of a Schottky diode in the form of gold/IN/substrate is 0.45 to 0.50 volts.

In TABLE II are set forth the optical and electronic properties of pyrolytically formed p-layers. $R_t$ is the gas-phase residence time. The dark conductivity is $\sigma_d$ and the activation energy is $E_a$. The dark conductivity and the activation energy are room temperature values. The bandgap, $E_g$, and the slope are measured from a plot as shown in FIG. 2A of the square root of the product of the absorption coefficient times the photon energy versus photon energy.

In FIG. 2A, there is a plot of square root of the product of the absorption coefficient and the photon energy against the photon energy for representative p-layers that are formed by pyrolytic conversion.

In FIG. 2B, there are shown schematic diagrams of relative positions of band edges ($E_v$ and $E_c$ and the Fermi level $E_f$) between a reference intrinsic layer (A), a high temperature formed p-layer (B), a low temperature pyrolytically formed p-layer (C), and a high temperature pyrolytically formed silicon-carbon alloy p-layer (D). The diagram has been constructed on the assumption that the different open circuit voltages observed in devices using these p-layers arise mainly from the position of the Fermi level.

Given the foregoing disclosure, other aspects of the invention will be readily apparent to those of ordinary skill in the art.

What is claimed is:

1. The method of fabricating an amorphous silicon semiconductor material on a substrate which comprises:
   decomposing one or more gaseous phase higher order silanes in the presence of a p-type catalytic dopant without photo-sensitization at a substrate temperature of about 200° C. and a pressure in the range from about 1 to 50 Torr to deposit on said substrate a p-type amorphous semiconductor material having a wide bandgap in the range from about 1.8 to 2.6 electron volts.

2. The method of claim 1 wherein the p-type dopant is a boron contributor.

3. The method of claim 2 wherein a carbon contributor is excluded from the reactants.

4. The method of claim 1 wherein said dopant is a gas which decomposes into radicals which react with said silanes to produce silicon containing radicals which undergo further gas-phase reaction.

5. The method of claim 1 wherein said decomposition takes place with gas-phase residence time in the range from about 1 to 500 seconds.

6. The method of claim 1 further including a carbon contributor.

7. The method of fabricating an amorphous silicon semiconductor material on a substrate, which comprises the steps of:
   (a) decomposing a catalytic dopant at a temperature below the normal decomposition temperature of at least one higher order silane;
   (b) decomposing said at least one higher order silane in the presence of the decomposed catalytic dopant;
   thereby to cause the decomposition of the at least one higher order silane at a temperature below that at which said at least one higher order silane is normally decomposable and thereby to deposit on a substrate maintained at a temperature of about 200° C. an amorphous silicon film which has a wider bandgap than is commonly associated with the decomposition of said at least one higher order silane.

8. The method of claim 7 further including additional hydrogen in the decomposed at least one higher order silane by virtue of the lower decomposition temperature.

* * * * *